(12) United States Patent
Douglas

(10) Patent No.: US 6,177,358 B1
(45) Date of Patent: Jan. 23, 2001

(54) PHOTO-STIMULATED ETCHING OF $CaF_2$

(75) Inventor: Monte A. Douglas, Coppell, TX (US)

(73) Assignee: Texas Instruments Incorporated, Dallas, TX (US)

( * ) Notice: Under 35 U.S.C. 154(b), the term of this patent shall be extended for 0 days.

(21) Appl. No.: 08/175,865

(22) Filed: Dec. 30, 1993

Related U.S. Application Data

(63) Continuation of application No. 07/929,081, filed on Aug. 12, 1992, now abandoned.

(51) Int. Cl.$^7$ .................. H01L 21/302; H01L 21/461
(52) U.S. Cl. ..................... 438/746; 438/745; 216/94; 216/96
(58) Field of Search ............ 156/635; 216/94, 216/96; 438/745, 746

(56) References Cited

U.S. PATENT DOCUMENTS

| | | | |
|---|---|---|---|
| 4,028,135 | * 6/1977 | Vig et al. | 134/1 |
| 4,478,677 | * 10/1984 | Chen et al. | 156/654 |
| 5,068,040 | 11/1991 | Jackson . | |

FOREIGN PATENT DOCUMENTS

| | | | |
|---|---|---|---|
| 516142 | * 12/1992 | (EP) . | |
| 0516142A2 | 12/1992 | (EP) | 21/311 |
| 119191 | * 6/1984 | (JP) . | |

OTHER PUBLICATIONS

S. Wolf et al., *Silicon Processing for the VLSI ERA vol. 1: Process Technology*, Lattice Press, Sunset Beach, CA (1989), pp. 520–523.*

Suemasu et al., "Room temperature negative differential resistance of Metal (CoSi2)/Insulator (CaF2) resonant tunneling diode", *Electronics Letters*, vol. 28, No. 15, Jul. 16, 1992, pp. 1432–1434.

Smith et al., "The electronic properties of epitaxial calcium fluoride–silicon structures", *Materials Research Soceity Symposia Proceedings*, vol. 54: Thin Films–Interfaces and Phenomena, Boston, USA, Dec. 2–6, 1985, pp. 295–305.

Toyama, et al., "Crack–Free PZT Thin Films Micropatterned on Silicon Substrate for Integrated Circuits", (abstract) Seiko Instruments Inc.

Watton, et al., "Materials and Technology Research in Uncooled Ferroelectric IR Detector Arrays", *Royal Signals and Radar Establishment, U.K.*., pp. 69–77.

(List continued on next page.)

*Primary Examiner*—Charles Bowers
*Assistant Examiner*—Erik Kielin
(74) *Attorney, Agent, or Firm*—Wade James Brady, III; Fred J. Telecky, Jr.

(57) ABSTRACT

Generally, and in one form of the invention, a method is presented for the photo-stimulated etching of a $CaF_2$ surface 12, comprising the steps of exposing the $CaF_2$ surface 12 to an ambient species 16, exciting the $CaF_2$ surface 12 and/or the ambient species 16 by photo-stimulation sufficiently to allow reaction of the $CaF_2$ surface 12 with the ambient species 16 to form $CaF_2$ ambient species products, and removing the ambient species 16 and the $CaF_2$ ambient species products from the $CaF_2$ surface 12. Other devices, systems and methods are also disclosed.

15 Claims, 1 Drawing Sheet

OTHER PUBLICATIONS

Kauffman, et al., "Studies of Reactions of Atomic and Diatomic Cr, Mn, Fe, Co, Ni, Cu, and Zn with Molecular Water at 15 K", *Journal of Physical Chemistry*, vol. 89, No. 16, pp. 3541–3547, 1985.

Park, et al., "Reactions and Photochemistry of Atmoic and Diatomic Nickel with Water at 15 k", *High Temperature Science*, pp. 1–15, vol. 25, 1988.

Hauge, et al., "Matrix Isolation Studies of the Reaction of Metal Atoms with Water", *High Temperature Science Inc.*, pp. 338–339, 1981.

Kauffman, et al., "Infrared Matric Isolation Studies of the Interactions of Mg, Ca, Sr, and Ba atoms and Small CLusters with Water", *High Temperature Science*, pp. 97–118, vol. 18, 1984.

Douglas, et al., "Matrix Isolation Studies by Electronic Spectroscopy of Group IIIA Metal–Water Photochemistry", *J. Chem. Soc., Faraday Trans. 1*, pp. 1533–1553, 79, 1983.

Douglas, et al., "Electronic Matrix Isolation Spectroscopic Studies of the Group IIA Metal–Water Photochemistry", *High Temperature Science*, pp. 201–235, vol. 17, 1984.

* cited by examiner

PHOTO-STIMULATED ETCHING OF CAF$_2$

CROSS-REFERENCE TO RELATED APPLICATIONS

This application is a Continuation of application Ser. No. 07/929,081, filed Aug. 12, 1992, now abandoned.

The following coassigned patent applications are hereby incorporated herein by reference:

| Ser. No. | Filing Date | TI Case No. |
|---|---|---|
| 07/871,862 | 04/20/92 | TI-15930 |

FIELD OF THE INVENTION

This invention generally relates to methods for etching CaF$_2$.

BACKGROUND OF THE INVENTION

Without limiting the scope of the invention, its background is described in connection with the etching of CaF$_2$ epitaxial layers for resonant tunneling devices, as an example.

Heretofore, in this field, resonant tunneling devices have been made using GaAs/AlGaAs structures. However, if a practical resonant tunneling technology for the silicon analog could be devised, such a technology could leverage the existing mature silicon processing technologies and device product lines.

A silicon-based resonant tunneling technology would require a material that can be epitaxially interposed between two silicon layers. The interposed, or sandwiched, epitaxially formed material must exhibit a bandgap larger than silicon. It is possible to utilize the CaF$_2$/Si interface to form resonant tunneling devices because CaF$_2$ has an energy bandgap of 12.5 eV. Moreover, CaF$_2$ has a room temperature lattice constant that is nearly identical to that of Si, and also has the same crystal space group as Si. Recent studies have indicated that the conduction band of Si is raised by 2.5 Ev, suggesting a CaF$_2$/Si heterostructure is a viable material for resonant tunneling. FIG. 1 shows the effect of the 2.5 Ev offset on the bandgap of CaF$_2$.

CaF$_2$ must be patterned along with Si to form the above described resonant tunneling devices, however no acceptable method of etching CaF$_2$ has yet been developed. There are three methods at present to etch CaF$_2$: water, dilute nitric acid (HNO$_3$) and dry etching with various energy sources. The water etch is very slow (the solubility of CaF$_2$ in water is quite low –0.002 grams in 100 grams of water at 25 C) as well as unreliable—it is difficult to determine when etching begins, when it finishes, or even when it is ongoing. Additionally, when water is used to etch CaF$_2$, it cracks the CaF$_2$ film, creating "ice floe" regions, and ruining the sample. The nitric acid approach is not much better than water. Undiluted, it will not etch CaF$_2$. Too much dilution results in the same outcome observed with the water etch, presumably associated with the higher water content. A 3:1 or 2:1 water:nitric acid dilution etches CaF$_2$ very rapidly –2–3 seconds for a 1000–2000 Angstrom film. However, the reproducibility of this etch is very poor; the etch rate cannot be consistently reproduced in large volume production. Moreover, severe undercut of the film is a significant problem with a rapid, isotropic wet etch. This is particularly important in the use of CaF$_2$ in resonant tunneling devices, which will require nanometer size structures.

A dry etch method driven by any of a variety of energy sources such as RF, microwave, ECR, etc. would introduce severe damage into the delicate CaF$_2$ crystalline structure, destroying any possibility of forming nanometer scale resonant tunneling devices.

A typical problem experienced with the above methods is that the CaF$_2$ will resist etching for a period of time and then start to etch along preferred regions very rapidly, causing the CaF$_2$ to lift off in flakes. This results in a residual surface that is well textured. Two types of texturing are most prevalent with the prior art etch methods: undulations on the surface reflective of thickness variations and cracking of the film. Undulation-type texturing is a disaster, since small variations in the epitaxial film thickness cause large changes in the material/device behavior which are peculiar to resonant tunneling components. Cracking of the film is equally unacceptable, since leakage through the film destroys any type of device performance. Also, resistivity is an important parameter of the material that must be carefully controlled—a crack in the film would undermine the fabricated value. Accordingly, improvements which overcome any or all of these problems are presently desirable.

SUMMARY OF THE INVENTION

It is herein recognized that a need exists for a method to etch CaF$_2$ which overcomes any or all of the problems discussed above. The present invention is directed towards meeting those needs.

Generally, and in one form of the invention, a method is presented for the photo-stimulated etching of a CaF$_2$ surface, comprising the steps of exposing the CaF$_2$ surface to an ambient species, exciting the CaF$_2$ surface and/or the ambient species by photo-stimulation sufficiently to allow reaction of the CaF$_2$ surface with the ambient species to form CaF$_2$/ambient species products, and removing the ambient species and the CaF$_2$/ambient species products from the CaF$_2$ surface.

In another form of the invention, a method is presented for the photo-stimulated etching of a CaF$_2$ surface, comprising the steps of covering the CaF$_2$ surface with water, irradiating the CaF$_2$ surface and the water with visible and/or ultraviolet light, and draining the water from the semiconductor surface.

In yet another form of the invention, a method is presented for the photo-stimulated etching of a CaF$_2$ surface, comprising the steps of placing the CaF$_2$ surface into a vacuum environment, lowering the temperature of the CaF$_2$ surface to the dew point, introducing water vapor into the vacuum environment, irradiating the CaF$_2$ surface and any condensed water with visible and/or ultraviolet light and returning the environment to a vacuum.

An advantage of the invention is that it allows for the etching of CaF$_2$ in a controlled manner without the texturing problems produced by prior art methods.

BRIEF DESCRIPTION OF THE DRAWINGS

The foregoing and further aspects of the invention are illustrated in the accompanying drawings wherein like elements are denoted by like reference designators and in which.

DETAILED DESCRIPTION OF PREFERRED EMBODIMENTS

Figure 1:
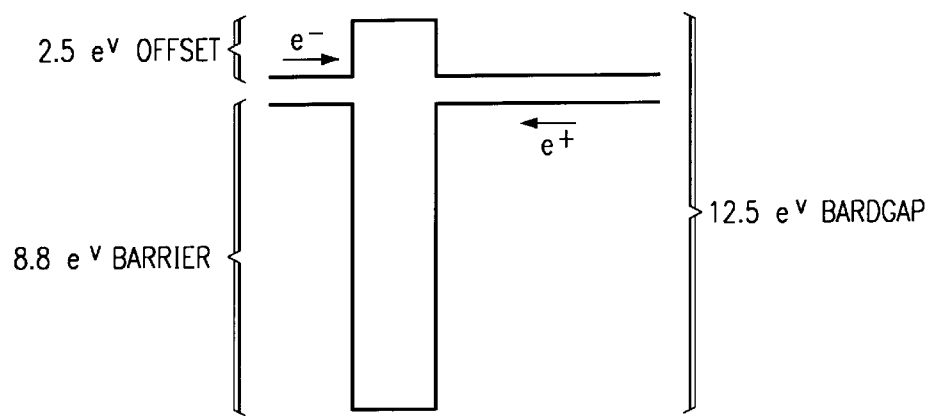
FIG. 1 is an energy band diagram showing the effect of the 2.5 eV offset of the bandgap of CaF$_2$.
Figure 2:
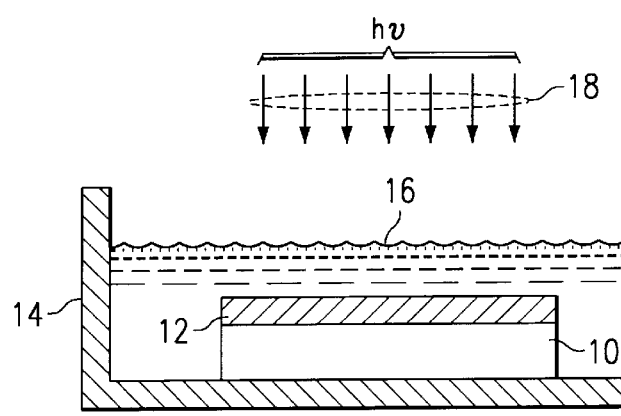
FIG. 2 is a diagram of suitable apparatus for performing the first preferred embodiment method.

A first preferred embodiment method of the present invention can be used to achieve smooth, continuous etching of $CaF_2$. With reference to FIG. 2, a silicon substrate 10, having an epitaxial layer 12 of $CaF_2$, is placed into a beaker 14. The beaker is then filled with water 16 so as to cover the surface of the $CaF_2$ layer 12. The $CaF_2$ layer 12 is then irradiated with optical energy 18 from, for example, a 200 Watt Hg/Xe arc lamp.

Table I shows analytical data taken from X-ray Photo-electron Spectroscopy (XPS) of a Si substrate sample with a 2000 Angstrom $CaF_2$ film epitaxially deposited on its surface. XPS is a surface sensitive analytical method and shows the surface to be predominately $CaF_2$ (with some surface impurities). It is important to note that the XPS measurement of this sample shows no indication of Si.

TABLE I

Before Etch

| Element | Atomic % | Possible Compound |
|---|---|---|
| F | 55.9 | F in $CaF_2$ |
| Ca | 24.7 | Ca in $CaF_2$ |
| C | 13.7 | graphite, hydrocarbon |
| O | 5.6 | organic |
| Mg | 0.2 | Mg in $MgF_2$ |

Table II lists the results of an XPS analysis on the same sample after a photo-stimulated etch using the first preferred embodiment method of the present invention. The $CaF_2$ on the sample surface has decreased to 22.3% and there is a relatively large presence of Si, indicating that the $CaF_2$ has been etched completely down to the Si substrate beneath. For this trial, a visual endpoint was used to stop the etch, i.e. a 2000 Angstrom layer of $CaF_2$ appears blue (due to diffraction) and the etch was stopped after it was observed that the blue coloration of the sample disappeared. The XPS analysis indicates that the etch should have been allowed to proceed longer since some of the $CaF_2$ remained after the etch.

TABLE II

After Etch

| Element | Atomic % | Possible Compound |
|---|---|---|
| O | 37.3 | organic, moisture |
| F | 15.1 | F in $CaF_2$ |
| C | 13.5 | graphite, hydrocarbon |
| Si | 13.0 | elemental Si |
| Si | 11.9 | silicate |
| Ca | 7.2 | Ca in $CaF_2$ |
| Na | 0.9 | $Na(O_x)$ |
| C | 0.7 | ether |
| Mg | 0.3 | Mg in $MgF_2$ |

An important point to note about the present invention is that the etch is preferential to $CaF_2$ and does not etch the Si substrate beneath. In fact, there is some evidence to suggest that the photo-stimulation of Si in a water ambient produces a very thin layer of $SiO_2$ on the substrate surface, which can be beneficial in "sealing" the surface during transport to the next wafer processing operation.

The sample wafers of Tables I and II were also analyzed using X-ray Fluorescence Spectroscopy (XRF), which is a bulk concentration analytical technique. The results of the XRF analysis, listed in Table III, show that the photo-stimulated etch removed 95% of the $CaF_2$ from the etched wafer as compared to the unetched control wafer.

TABLE III

Bulk Analysis

| Measurement | Ca ($\mu g/cm^2$) | Ca (atoms/$cm^2$) |
|---|---|---|
| Before Etch | 17.2 | $2.58 \times 10^{17}$ |
| After Etch (center) | 0.924 | $1.39 \times 10^{16}$ |
| After Etch (edge) | 0.884 | $1.33 \times 10^{16}$ |

The first preferred embodiment of the present invention may optionally be modified in several ways. For example, the water 16 may be ultrasonically or megasonically agitated to provide a mechanical aid to the removal of the reaction products from the substrate 10 surface. Also, rather than immersing the wafer 10 into a stagnant water 16 reservoir, it may be placed into a flowing or spraying water atmosphere. The moving water would ensure that solubility limits (which would limit removal by dissolution into the water) would not be achieved.

Although the chemistry of photo-stimulated etching of $CaF_2$ is not completely understood at the present time, it is believed that a possible mechanism for the reaction may involve electronic excitation of a ground-state, $CaF_2$-ambient species adduct precursor. The $CaF_2$-ambient species adduct precursor that is excited may be the $CaF_2$ surface itself, or the ambient species (e.g. a water molecule in the first preferred embodiment), or a complex that is formed between the two entities (see formulae I–III, below). The excitation may be electronic excitation, vibrational excitation, dissociative excitation, etc., for example. The lifetime of the excitation is sufficient to allow reaction of the $CaF_2$-ambient species adduct to a $CaF_2$ product to proceed along an excited state reaction coordinate that is not encumbered by energy barriers that undermine reaction along the ground-state potential energy (PE) surface. Both the $CaF_2$ and the ambient species may need to be excited at the same time. The resultant product, which contains the material to be etched, may then be removed from the surface of the wafer 10 along with the ambient species, or the product may diffuse into the ambient species and therefore be removed when the ambient species is removed. Whatever the mechanism may be, the $CaF_2$ on the surface is etched and can be removed.

Following are schematic representations of three possible reactions which would form a $CaF_2$-ambient species reaction product which is soluble:

I. $CaF_2 + h\upsilon \rightarrow CaF_2^*$
   $CaF_2^* + AS \rightarrow CaF_2/AS^*$ or $CaF_2/AS$
   (which is soluble)

II. $AS + h\upsilon \rightarrow AS^*$
    $AS^* + CaF_2 \rightarrow CaF_2/AS^*$ or $CaF_2/AS$
    (which is soluble)

III. $CaF_2 \text{---} AS + h\upsilon \rightarrow CaF_2/AS^*$ or $CaF_2/AS$
     (which is soluble)

where $CaF_2 = CaF_2$ surface
$CaF_2^* = $ energetically excited $CaF_2$ surface
AS = ambient species
AS* = energetically excited ambient species
$CaF_2/AS$ = reaction product between $CaF_2$ & AS
$CaF_2/AS^*$ = energetically excited reaction product
$CaF_2 \text{---} AS = CaF_2$ weakly bound to AS
moreover: AS = P or D where: P=parent reactant
D=daughter reactant
and D is created spontaneously, is in equilibrium or is generated by photo-stimulation: P+hυ=D.

It is important to note that the photo-stimulated etching of $CaF_2$ is a directional etch process. Because the reaction is catalyzed to a large extent by photo-exposure, areas not exposed to photo-stimulation, such as those areas under a photoresist mask, will not etch. This directionality of etch is a major improvement over conventional wet etches which undercut the mask, making sharply delineated or very small structures difficult, if not impossible, to define. Another benefit of the photo-stimulated etching is that in some cases the photoresist mask may be eliminated all together. In this case the photo-stimulation may be applied as a patterned exposure, etching the $CaF_2$ surface only where the photo-energy is directed and not etching the $CaF_2$ surface in the non-stimulated areas. For large surfaces, a step-and-repeat exposure method may be employed.

Figure 3:
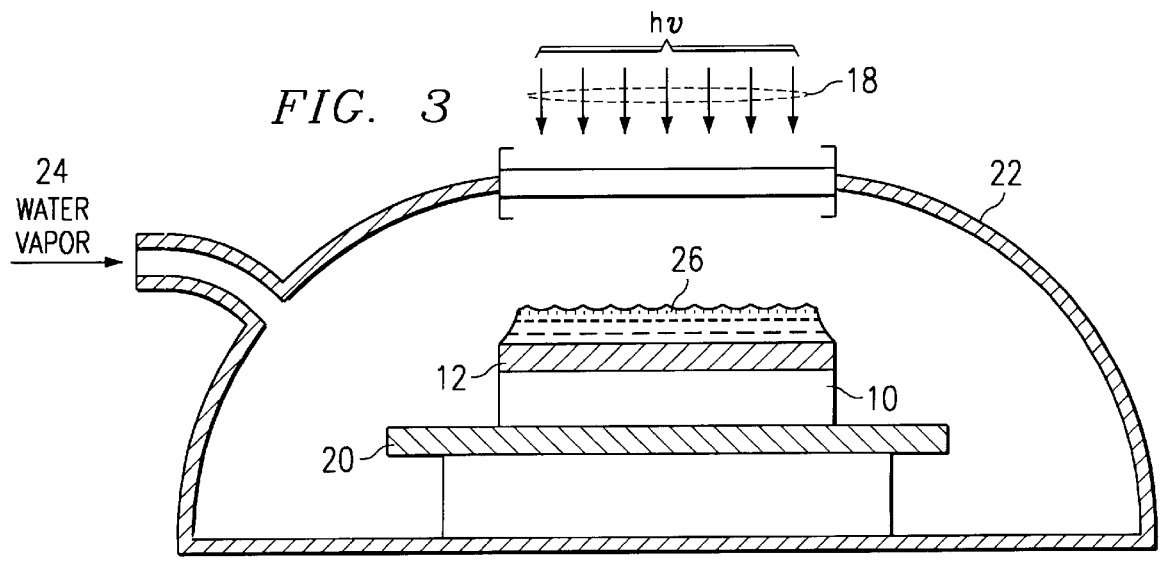
FIG. 3 is a diagram of suitable apparatus for performing the second preferred embodiment method.

FIG. 3 illustrates a suitable apparatus setup to implement a second preferred embodiment method of the present invention. A silicon substrate 10, having an epitaxial layer 12 of $CaF_2$, is placed onto a temperature controlled chuck 20. The substrate 10/chuck 20 is then placed into a vacuum chamber 22 which is then evacuated. Next, the temperature of the chuck 20 (and hence the substrate 10/epilayer 12) is lowered to the dew point or below it, after which water vapor 24 is introduced into the chamber 22. After a period of time, a thin layer of condensed water 26 will form preferentially on the $CaF_2$ 12 surface due to its temperature being at or below the dew point. Then, the substrate 10/water 26 is irradiated with photo-energy 18 from, for example, a 200 Watt, high pressure, Hg/Xe arc lamp for five minutes. Finally, the chamber 22 is evacuated, removing all of the water vapor 24, condensed water 26 and etched $CaF_2$. Optionally, the substrate can be rinsed with water for five seconds, for example, and then dried with nitrogen gas to remove $CaF_2$ reaction products.

The second preferred embodiment method may be modified in several ways. For example, instead of using a light source to excite the $CaF_2$ and/or ambient species, other energy sources such as electron flux, electromagnetic field sources (e.g. RF, microwave, etc.), or energetic ion energy prepared and delivered to the surface by various plasma techniques (e.g. electron cyclotron reactors (ECR), etc) or broad area sources of electrons or ions under high vacuum, for example. After water has condensed onto the surface, the surface may be heated above the dew point to remove all water molecules except those that have already formed adducts with the $CaF_2$ (this will provide for more efficient exposure of the adducts to photo-stimulation). Also, the vapor phase or liquid phase ambient species may be acidic or alkaline (e.g. HCl or $NH_4OH$) or one of the standard wet etch solutions (e.g. HF). It will be appreciated that most wet etch scenarios would benefit from an excitation of the $CaF_2$ surface and/or ambient species as described in the foregoing. Additionally, the water vapor introduced into the chamber may be wet or dry steam.

Preliminary analysis of silicon surfaces exposed to photo-stimulation in a water ambient show a fourfold increase of silicon oxide ($SiO_x$) at the surface after treatment (the analysis technique employed is sensitive to a depth of approximately 40 Angstroms). This provides a significant added benefit in that the surface is effectively "sealed" after $CaF_2$ etch to protect it from further contamination before the next processing step can be performed.

A few preferred embodiments have been described in detail hereinabove. It is to be understood that the scope of the invention also comprehends embodiments different from those described, yet within the scope of the claims.

The term photo-stimulated is used herein for convenience of description, however the term "photo" may be replaced with "radiant energy" or "energetic ion energy" throughout the specification and the appended claims.

Words of inclusion are to be interpreted as nonexhaustive in considering the scope of the invention.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a $CaF_2$ surface, comprising the steps of:
   (a) contacting said surface with water; and
   (b) irradiating said surface with visible and/or ultraviolet radiant energy at an intensity sufficient to produce directional etching of said surface.

2. The method of claim 1 wherein step (a) comprises immersing said surface in water.

3. The method of claim 1 wherein step (a) comprises condensing a vapor of water on said surface.

4. The method of claim 1, wherein said radiant energy is provided by an arc lamp.

5. The method of claim 4, wherein said arc lamp is a 200 watt Hg/Xe arc lamp.

6. The method of claim 1, wherein step (a) comprises flowing water over said surface.

7. The method of claim 1 further comprising agitating water during step (b).

8. A method of patterning a $CaF_2$ film deposited on a substrate, said method comprising:
   (a) constructing a mask of patterned photoresist overlying said film, thereby dividing said film into exposed areas and covered areas;
   (b) contacting said exposed areas with water; and
   (c) directionally etching said $CaF_2$ film from said exposed areas using radiant energy at an intensity sufficient to produce directional etching of said film.

9. The method of claim 8, wherein said substrate comprises silicon, whereby step (c) also forms a surface layer of silicon dioxide on said silicon substrate in said exposed areas after removal of said $CaF_2$ film.

10. The method of claim 8 wherein said radiant energy is provided by an arc lamp.

11. The method of claim 8 wherein step (b) comprises immersing said substrate in water.

12. The method of claim 8, wherein step (b) comprises flowing water over said substrate.

13. A method of patterning a $CaF_2$ film deposited on a substrate, said method comprising:
   (a) contacting said film with water; and
   (b) supplying a patterned exposure of radiant energy to said film at an intensity sufficient to directionally remove areas of said film exposed to said radiant energy.

14. The method of claim 13, wherein step (b) patterns said film using a step-and-repeat exposure method.

15. The method of claim 13, wherein said radiant energy is supplied by a Hg/Xe arc lamp.

* * * * *